US006395093B1

United States Patent
Ayers

(10) Patent No.: US 6,395,093 B1
(45) Date of Patent: May 28, 2002

(54) SELF CONTAINED, INDEPENDENT, IN-VACUUM SPINNER MOTOR

(75) Inventor: Marion J. Ayers, Livermore, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/909,178

(22) Filed: Jul. 19, 2001

(51) Int. Cl.⁷ .......................... C23C 14/00; C23C 16/00
(52) U.S. Cl. .................. 118/698; 118/729; 118/730; 204/298.23; 204/298.28; 310/89; 318/3; 318/16; 318/139
(58) Field of Search ................ 118/698, 729, 118/730; 204/298.23, 298.28; 310/89; 318/3, 16, 139

(56) References Cited

U.S. PATENT DOCUMENTS

| 4,858,556 A | 8/1989 | Siebert ................. 118/664 |
| 5,336,385 A | 8/1994 | Shimose et al. ........ 204/298.03 |
| 6,082,296 A | 7/2000 | Van Tran .............. 118/723 EB |
| 6,083,357 A | 7/2000 | Begin et al. ........... 204/192.12 |

Primary Examiner—Richard Bueker
(74) Attorney, Agent, or Firm—Eddie E. Scott; Alan H. Thompson

(57) ABSTRACT

An independent, self contained apparatus for operation within a vacuum chamber. A sealed enclosure is located in the chamber. The enclosure contains its own atmosphere independent of the vacuum in the chamber. A motor, power unit, and controls are located entirely within the enclosure. They do not have a direct structural connection outside of the enclosure in any way that would effect the atmosphere within the enclosure. The motor, power unit, and controls drive a spinner plate located outside the enclosure but within the vacuum chamber.

18 Claims, 2 Drawing Sheets

SELF CONTAINED, INDEPENDENT, IN-VACUUM SPINNER MOTOR

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of Endeavor

The present invention relates to in-vacuum systems and more particularly to an in-vacuum power system.

2. State of Technology

U.S. Pat. No. 4,858,556 for a method and apparatus for physical vapor deposition of thin films by Jerome F. Siebert, patented Aug. 22, 1989, provides the following description, "A physical vapor deposition system is disclosed for routinely achieving unprecedented processing uniformity of thin films on substrates of a size comparable to or larger than the source. The system includes a plurality of substrates; a plurality of deposition, etching, and/or heating sources; a plurality of mobile in-situ process monitors for obtaining the fundamental processing profiles that characterize the processing properties of each source; and mobile fixturing responsive to the fundamental processing profiles for effecting prescribed motion scenarios of the substrate relative to the source; to thus provide the means for achieving extremely uniform as well as an unprecedented range of prescribed non-uniform final thin film processing profiles, irrespective of the size of the substrate relative to the size of the source."

U.S. Pat. No. 5,336,385 for a sputtering apparatus by Yuichiro Shimose and Jiro Ikeda, patented Aug. 9, 1994, provides the following description, "An improved sputtering apparatus is provided which can judge whether or not a normal thin film has been satisfactorily deposited on the surface of a substrate to be processed in a film deposition apparatus. The judgment is made immediately after the sputtering process on the basis of the detection results of the pressure in a vacuum chamber and the waveform of discharge output power supplied from a discharge power source. The improvement comprises necessary condition-determining means for determining conditions necessary for depositing a normal thin film on the surface of the substrate to be processed, executed result-detecting means for detecting the results of a thin film deposition process, comparing means for comparing the executed results detected by the executed result-detecting means with the necessary conditions determined by the necessary condition-determining means, and judging means for judging whether or not the thin film-deposition process has been satisfactorily performed on the basis of the comparison results produced from the comparing means. Further, when the improved sputtering apparatus of this invention is employed in the continuous manufacturing line, the abnormalities in the film deposition process can be detected at the earliest possible step in the line, whereby the efficiency thereof can be significantly enhanced."

U.S. Pat. No. 6,082,296 for thin film deposition chamber by Chuong Van Tran, patented Jul. 4, 2000, provides the following description, "A thin film deposition chamber utilizes a planetary fixture and two vapor sources to generate two partially overlapping vapor streams. The two vapor streams create a combined distribution profile. The planetary fixture holds a plurality of substrates in a position similar to a portion of the combined distribution profile."

U.S. Pat. No. 6,083,357 for a system for and method of providing a controlled deposition on wafers by Robert George Begin and Peter J. Clarke, patented Jul. 4, 2000, provides the following description, "A robotic arm assembly in a transport module is expansible to have an effector at its end receive a substrate in a cassette module and is then contracted and rotated with the effector to have the effector face a process module. Planets on a turntable in the process module are rotatable on first parallel axes. The turntable is rotatable on a second axis parallel to the first axes to move successive planets to a position facing the effector. At this position, an alignment assembly is aligned with, but axially displaced from, one of the planets. This assembly is moved axially into coupled relationship with such planet and then rotated to a position aligning the substrate on the effector axially with such planet when the arm assembly is expanded. A lifter assembly aligned with, and initially displaced from, such planet is moved axially to lift the substrate from the effector. The arm assembly is then contracted, rotated with the effector and expanded to receive the next cassette module substrate. The lifter assembly is then moved axially to deposit the substrate on the planet. When the substrates have been deposited on the planets, the planets are individually rotated on the first axes by a stator rotatable on the second axis with the turntable. Guns having a particular disposition relative to the planets provide controlled depositions on the substrates during such planet rotations. The planets and the end effector hold the substrates at peripheral positions displaced from the controlled substrate depositions."

SUMMARY OF THE INVENTION

Features and advantages of the present invention will become apparent from the following description. Applicants are providing this description, which includes drawings and examples of specific embodiments, to give a broad representation of the invention. Various changes and modifications within the spirit and scope of the invention will become apparent to those skilled in the art from this description and by practice of the invention. The scope of the invention is not intended to be limited to the particular forms disclosed and the invention covers all modifications, equivalents, and alternatives falling within the spirit and scope of the invention as defined by the claims.

The present invention provides an independent, self contained apparatus for operation within a chamber containing a vacuum and a functioning unit. An enclosure is adapted to be located in the chamber. The enclosure contains its own atmosphere independent of the vacuum in the chamber. A motor is located entirely within the enclosure. The motor does not have a direct structural connection outside of the enclosure in any way that would effect the atmosphere within the enclosure. The motor is operatively connected to the functioning unit. A power source is located within the enclosure. The power source does not have a direct structural connection outside of the enclosure in any way that would effect the atmosphere within the enclosure. The power source is operatively connected to the motor. Controls are located within the enclosure. The controls do not have a direct structural connection outside of the enclosure in any way that would effect the atmosphere within the enclosure. The controls are operatively connected to the power source and the motor.

The invention is susceptible to modifications and alternative forms. Specific embodiments are shown by way of example. It is to be understood that the invention is not limited to the particular forms disclosed. The invention covers all modifications, equivalents, and alternatives falling within the spirit and scope of the invention as defined by the claims.

BRIEF DESCRIPTION OF THE DRAWINGS

The accompanying drawings, which are incorporated into and constitute a part of the specification, illustrate specific embodiments of the invention and, together with the general description of the invention given above, and the detailed description of the specific embodiments, serve to explain the principles of the invention.

DETAILED DESCRIPTION OF THE INVENTION

Figure 1:
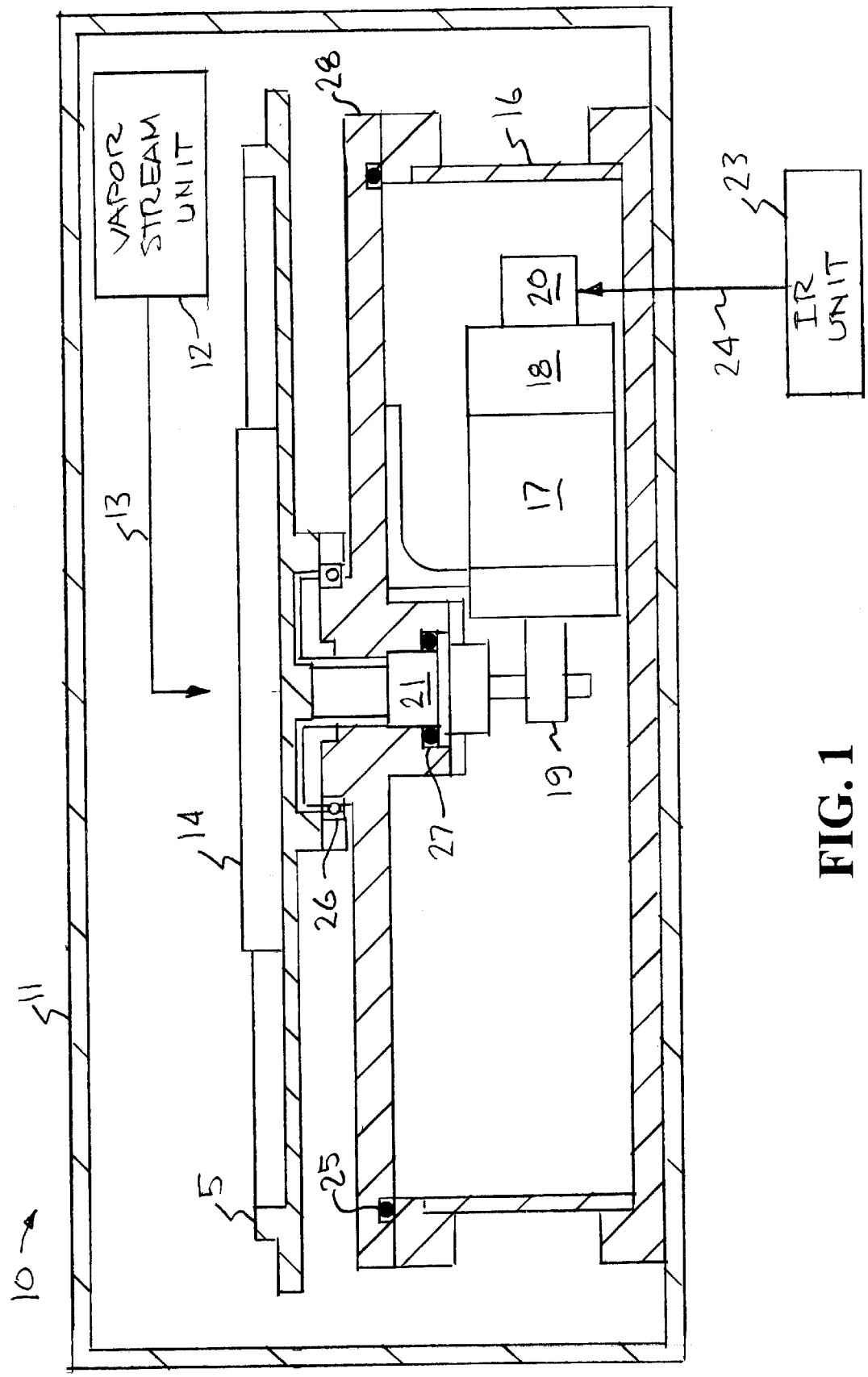
FIG. 1 is a cross-sectional side view of an embodiment of a system constructed in accordance with the present invention.

Referring now to the drawings, to the following description, and to incorporated information; a detailed description including specific embodiments of the invention are described. The detailed description of the specific embodiments, together with the general description of the invention, serve to explain the principles of the invention.

The present invention provides an independent, self contained apparatus for operation within a chamber containing a vacuum and a functioning unit. An enclosure is adapted to be located in the chamber. The enclosure contains its own atmosphere independent of the vacuum in the chamber. A motor is located entirely within the enclosure. The motor does not have a direct structural connection outside of the enclosure in any way that would effect the atmosphere within the enclosure. The motor is operatively connected to the functioning unit. A power source is located within the enclosure. The power source does not have a direct structural connection outside of the enclosure in any way that would effect the atmosphere within the enclosure. The power source is operatively connected to the motor. Controls are located within the enclosure. The controls do not have a direct structural connection outside of the enclosure in any way that would effect the atmosphere within the enclosure. The controls are operatively connected to the power source and the motor.

Referring to FIG. 1, a cross-sectional side view of an embodiment of a system constructed in accordance with the present invention is shown. This embodiment provides a self contained independent in-vacuum spinner motor. This embodiment of an in-vacuum spinner motor is a result of the complexities involved with vacuum to air interface for both electrical and mechanical feed-throughs. The primary function is to rotate any desired sample at a specified rate to improve uniformity over a surface during a multi-layer deposition.

The independent, self-contained independent in-vacuum spinner motor system is generally designated by the reference numeral 10. The in-vacuum spinner motor system is designed for operation within a chamber 11 containing a vacuum. A deposition system is located within the chamber 11. The deposition system includes a vapor stream producing unit 12 that provides vapor stream 13. The vapor stream 13 is used to deposit a film on a work piece 14. Processing of pure and uniform thin films of a wide variety of materials onto an equally wide variety of types and sizes of substrate materials is a key processing requirement in the manufacture of many high technology products including integrated circuits, magnetic and optical memory media, active and passive solar energy devices, and optical coatings.

The work piece 14 is located in a fixture 15. As shown, the fixture 15 is a chuck/spinner plate. The fixture must be moved to assure that the desired film is deposited on the work piece 14 in the desired manner. The system for moving the work piece 14 includes an enclosure 16 adapted to be located in the chamber 11. The top of the enclosure 16 is closed by an aluminum top 28. O-Ring seals 25 and 27 insure a vacuum tight seal. The enclosure 16 contains its own atmosphere independent of the vacuum in the chamber 11. A motor 17 is located entirely within the enclosure 16. The motor 17 does not have a direct structural connection outside of the enclosure 16 in any way that would effect the atmosphere within the enclosure 16. The motor 17 is operatively connected to the fixture 15. The connection between the motor 17 and the fixture 15 includes worm drive 19 ferro-fluid feed through 21 and flex coupling 22. A spider connection could also be used. The bearing 26 allows the chuck/spinner plate 15 to rotate freely. The Flex coupling 22 is a ferro-fluidic feed through connection that eliminates any structural connection outside of said enclosure that would effect the atmosphere within the enclosure. More importantly, all materials within the atmosphere inside the enclosure 16 are prevented from entering the vacuum within the vacuum chamber 11.

A power source 18 is located within the enclosure 16. The power source 18 does not have a direct structural connection outside of the enclosure in any way that would effect the atmosphere within the enclosure. The power source 18 shown in FIG. 1 is a battery unit. Controls 20 are located within the enclosure 16. The controls 20 do not have a direct structural connection outside of the enclosure in any way that would effect the atmosphere within the enclosure. The controls are operatively connected to the power source 18 and the motor 17. The controls 20 can be activated by a magnetic switch that does not require a direct structural connection. The controls 20 can also be activated by an IR unit 23 that sends an IR signal 24 to controls 20 without requiring a direct structural connection.

Figure 2:
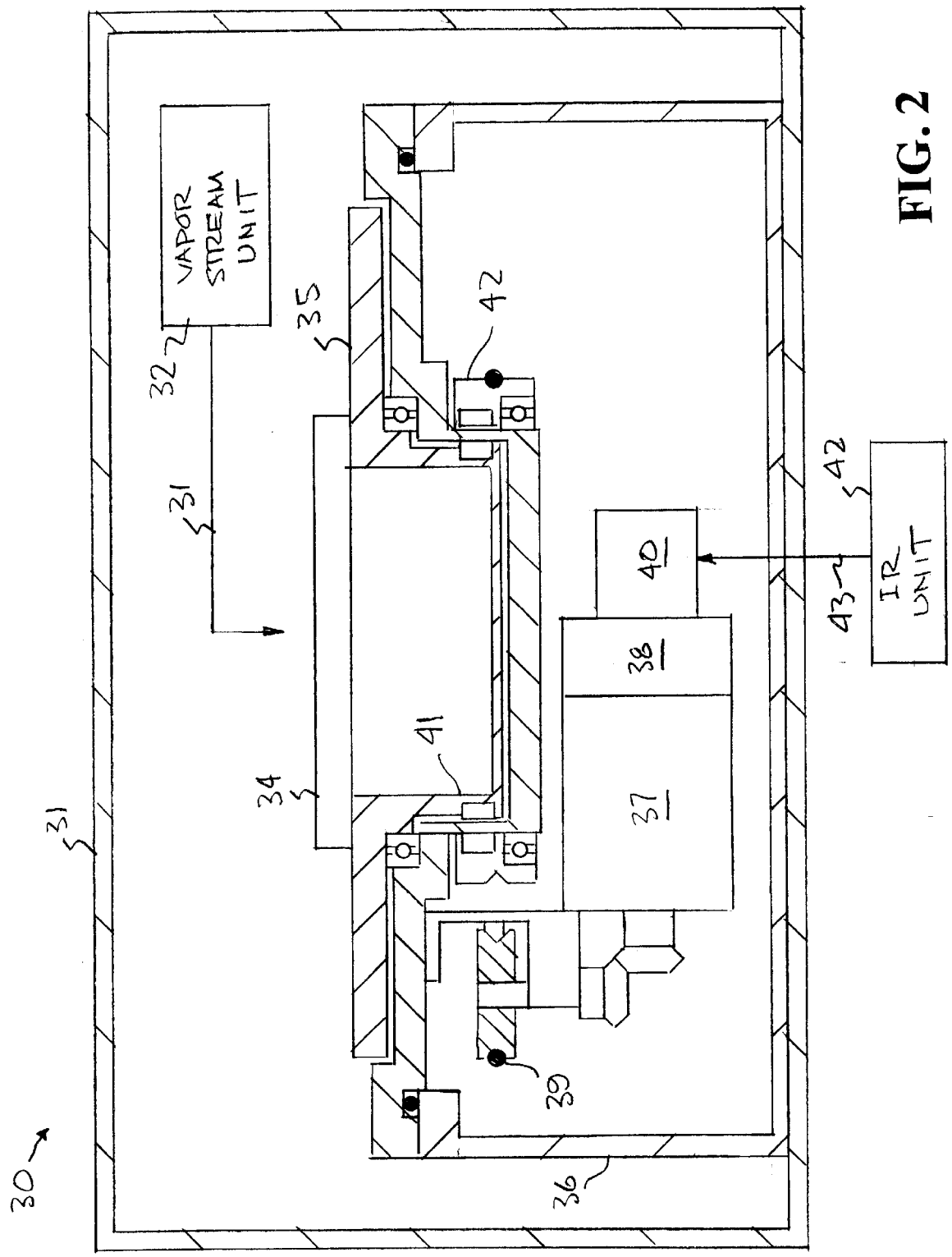
FIG. 2 is a cross-sectional side view of another embodiment of a system constructed in accordance with the present invention.

Referring to FIG. 2, a cross-sectional side view of another embodiment of a system constructed in accordance with the present invention is shown. This embodiment provides a self-contained independent in-vacuum spinner motor. The independent, self-contained independent in-vacuum spinner motor system is generally designated by the reference numeral 30. The in-vacuum spinner motor system is designed for operation within a chamber 31 containing a vacuum. A deposition system is located within the chamber 31. The deposition system includes a vapor stream-producing unit 32 that provides vapor stream 33. The vapor stream 13 is used to deposit a film on a work piece 34. Processing of pure and uniform thin films of a wide variety of materials onto an equally wide variety of types and sizes of substrate materials is a key processing requirement in the manufacture of many high technology products including integrated circuits, magnetic and optical memory media, active and passive solar energy devices, and optical coatings.

The work piece 34 is located in a fixture 35. As shown, the fixture 35 is a chuck/spinner plate. The fixture must be moved to assure that the desired film is deposited on the work piece 34 in the desired manner. The system for moving the work piece 34 includes an enclosure 36 adapted to be located in the chamber 31. The enclosure 36 contains its own atmosphere independent of the vacuum in the chamber 31. A motor 37 is located entirely within the enclosure 36. The motor 37 does not have a direct structural connection outside of the enclosure 36 in any way that would effect the atmosphere within the enclosure 36. The motor 37 is operatively connected to the fixture 35. The connection includes an outside magnetic array 41 and an inside magnetic array 42. A drive belt 39 connected to motor 37 allow the motor 37 to drive the chuck spinner plate 35. The connection between the motor 37 and the fixture 35 is a magnetic coupling connection that eliminates any structural connection from inside to outside of said enclosure that would effect the atmosphere within the enclosure. More importantly, all materials within the atmosphere inside the enclosure 36 are prevented from entering the vacuum within the vacuum chamber 31.

A power source 38 is located within the enclosure 36. The power source 38 does not have a direct structural connection outside of the enclosure in any way that would effect the atmosphere within the enclosure. The power source 38 shown in FIG. 2 is a battery unit. Controls 40 are located within the enclosure 36. The controls 40 do not have a direct structural connection outside of the enclosure in any way that would effect the atmosphere within the enclosure. The controls are operatively connected to the power source 38 and the motor 37. The controls 40 can be activated by a magnetic switch that does not require a direct structural connection. The controls 40 can also be activated by an IR unit 42 that sends an IR signal 43 to controls 40 without requiring a direct structural connection.

Processing of pure and uniform thin films of a wide variety of materials onto an equally wide variety of types and sizes of substrate materials is a key processing requirement in the manufacture of many high technology products including integrated circuits, magnetic and optical memory media, active and passive solar energy devices, and optical coatings. There are several types of processes that may be carried out in sputtering systems including thermal evaporation, ion-beam etching and magnetron sputtering, and molecular-beam epitaxy. A common problem with each of these processes is how to uniformly process high-purity homogeneous films over any given substrate area, while maintaining acceptable commercial throughputs and source efficiencies.

The "canned spinner motor" is designed in 2 styles, the first shown in FIG. 1, built for medium-vacuum (10–7 torr) applications, the second shown in FIG. 2, designed for UHV (ultra high vacuum 10—10 torr). Both systems are entirely self-contained and independent. Each canned spinner motor houses a 12 v battery pack and small DC motor that provides anywhere from 10–20 hours run time. The spinner motors are activated using an internal centrifugal switch or remotely using an IR transmitter.

These motors are being used in an ion-beam deposition system for coating Si wafers and Quartz substrates with a uniform multi-layer of Mo and Si. This system eliminates the use of complex slip-rings and particle generating brushes making it ideal for low defect deposition such as EUV Lithography. For example it can be used in the Ultra Clean Ion Beam Sputter Deposition System which is a collaboration between Lawrence Livermore National Laboratory's Laser Programs and Veeco Instruments Inc. of Plainview, N.Y. The new machine, called the LDD-IBSD 350, deposits extremely thin single and multilayer film coatings with angstrom accuracy onto substrates of silicon and other materials. These films are used in creating advanced computer chips, hard disk drives, and the master patterns for extreme ultraviolet (EUV) lithography. The machine significantly advances the state of the art by drastically lowering the number of thin-film defects it deposits by a factor of 100,000 over existing equipment. Precise application of thin films is critical to the $120-billion semiconductor manufacturing industry and the $100-billion magnetic recording industry.

Existing ion-beam systems only allow for singular rotation of a sample about an axis. It is desirable to rotate the sample itself as it rotated off axis allowing compound rotation. Using the currently available machine it was not feasible to incorporate another rotation due to lack of space and feed-throughs necessary to run electrical and mechanical components. These systems require a great deal of hardware and are not easily accessible. The canned spinner motor system of the present invention allows any vacuum chamber the immediate possibility of having a mechanical spinner motor or drive system without any modification to the existing system.

The present invention provides a method of improving a deposition system wherein a film deposition chamber is operated in a vacuum. The present invention provides a retro-fit system that can be added to existing systems without extensive cost.

The film deposition chamber contains a vapor stream producing unit and a fixture holds a work piece for receiving deposition from the vapor stream. The method includes the steps of providing an enclosure adapted to be located in the deposition chamber. The enclosure contains its own atmosphere independent of the vacuum. A motor is located entirely within the enclosure without direct structural connection outside of the enclosure that would effect the atmosphere. The motor is operatively connected to the fixture. A power source is located within the enclosure without structural connection outside of the enclosure that would effect the atmosphere. The power source is operatively connected to the motor. Controls are located within the enclosure without structural connection outside of the enclosure that would effect the atmosphere. The controls are operatively connected to the power source and the motor. A magnetic reed control unit is provided inside of the enclosure and is operatively connected to the power source. The magnetic reed control unit is operated from outside the enclosure using a magnet unit. Another control system comprises providing an IR control unit inside of the enclosure operatively connected to the power source and operating the IR control unit from outside the enclosure using an IR unit.

The spinner motors shown in FIGS. 1 and 2 are completely independent and self-contained, both mechanics and utilities are vacuum sealed inside the can at atmospheric conditions. Most importantly is the elimination of particle generating slip-rings and the conventional use of rotary feed-throughs which are vital to success. The Spinner motors are compatible for both high and UHV vacuum systems. The spinner motor shown in FIG. 1 is designed for systems that operate at 10–7 torr and below consist of a stainless steel can with a welded hermetically sealed feed-through. A feed-through can be used to charge, activate and or diagnose the spinner motor and its components. The can top is made of aluminum and uses an O-ring seal to interface with the can. The drive mechanism is coupled to a ferro-fluid feed-through and driven via a worm gear to the outside of the can. The ferro-fluid feed-through is coupled to a chuck or spinner plate of specified requirements. The spinner plate runs true to within t 0.002 over a 9" diameter via a thin mechanical bearing.

The spinner motor shown in FIG. 2 is designed for use in UHV systems utilizes the same stainless steel can and electrical feed-through. The primary difference in this design is that the mechanics are not driven through a ferro-fluid feed-through. For use in a UHV environment the drive system had to be coupled in a different means. To drive the spinner plate there is an array of magnets on the inside and an array on the outside. Both arrays are recessed into an aluminum ring that rotates freely on a thin bearing. As the inside magnetic array rotates via a belt drive the magnetic flux forces the outside ring to rotate at the same speed.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

The invention claimed is:

1. An independent, self contained apparatus for operation within a film deposition chamber containing a vacuum and a functioning unit, comprising:
   an enclosure adapted to be located in said chamber, said enclosure containing its own atmosphere independent of said vacuum;
   a motor located entirely within said enclosure without direct structural connection outside of said enclosure that would effect said atmosphere, said motor operatively connected to said functioning unit;
   a power source located within said enclosure without structural connection outside of said enclosure that would effect said atmosphere, said power source operatively connected to said motor; and
   controls located within said enclosure without structural connection outside of said enclosure that would effect said atmosphere, said controls operatively connected to said power source and said motor.

2. The independent, self contained apparatus of claim 1 wherein said power source is a battery unit.

3. The independent, self contained apparatus of claim 1 wherein said controls are a magnetic reed control system.

4. The independent, self contained apparatus of claim 1 wherein said controls are an IR control system.

5. The independent, self contained apparatus of claim 1 wherein said motor is operatively connected to said functioning unit by a ferro-fluidic feed through connection.

6. The independent, self contained apparatus of claim 1 wherein said motor is operatively connected to said functioning unit by a magnetic drive connection.

7. The independent, self contained apparatus of claim 1 wherein said functioning unit is a spinner plate.

8. The independent, self contained apparatus of claim 1 wherein said functioning unit is a chuck and spinner plate.

9. The independent, self contained apparatus of claim 1 wherein said chamber is a film deposition chamber operated in a vacuum and said film deposition chamber includes a vapor stream.

10. The independent, self contained apparatus of claim 9 wherein said functioning unit is a fixture for holding a piece for receiving deposition from said vapor stream.

11. A method of improving a deposition system, said deposition system having a film deposition chamber operated in a vacuum, said deposition chamber containing a vapor stream producing unit and a fixture for holding a piece for receiving deposition from said vapor stream, comprising the steps of:
   providing an enclosure adapted to be located in said deposition chamber, said enclosure containing its own atmosphere independent of said vacuum;
   locating a motor entirely within said enclosure without direct structural connection outside of said enclosure that would effect said atmosphere, said motor operatively connected to said fixture;
   locating a power source within said enclosure without structural connection outside of said enclosure that would effect said atmosphere, said power source operatively connected to said motor; and
   locating controls within said enclosure without structural connection outside of said enclosure that would effect said atmosphere, said controls operatively connected to said power source and said motor.

12. The method of claim 11 wherein said step of locating controls within said enclosure comprises providing a magnetic reed control unit inside of said enclosure operatively connected to said power source and operating said magnetic reed control unit from outside said enclosure using a magnet unit.

13. The method of claim 11 wherein said step of locating controls within said enclosure comprises providing an IR control unit inside of said enclosure operatively connected to said power source and operating said IR control unit from outside said enclosure using an IR unit.

14. In a film deposition chamber operated in a vacuum, said film deposition chamber including a vapor stream and a fixture for holding a piece for receiving deposition from said vapor stream, a self contained apparatus for positioning said piece in said vapor stream, comprising:
   an enclosure adapted to be located in said vacuum, said enclosure containing its own atmosphere;
   a motor located entirely within said enclosure and said atmosphere without structural connection outside of said enclosure;
   a power source located within said enclosure and said atmosphere and operatively connected to said motor; and
   controls located within said enclosure without structural connection outside of said enclosure that would effect said atmosphere, said controls operatively connected to said power source and said motor.

15. The self contained apparatus of claim 14 wherein said power source is located entirely within said enclosure and said atmosphere without structural connection outside of said enclosure.

16. The self contained apparatus of claim 15 wherein said power source is a battery unit.

17. The self contained apparatus of claim 14 wherein said control system is a magnetic reed control system.

18. The self contained apparatus of claim 14 wherein said control system is an IR control system.

* * * * *